(12) United States Patent
Cheng

(10) Patent No.: US 10,269,788 B2
(45) Date of Patent: Apr. 23, 2019

(54) ARRAY PANEL WITH ESD PROTECTION CIRCUIT

(71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/535,457

(22) PCT Filed: Sep. 8, 2016

(86) PCT No.: PCT/CN2016/098430
§ 371 (c)(1),
(2) Date: Jun. 13, 2017

(87) PCT Pub. No.: WO2017/173779
PCT Pub. Date: Oct. 12, 2017

(65) Prior Publication Data
US 2018/0204829 A1 Jul. 19, 2018

(30) Foreign Application Priority Data
Apr. 6, 2016 (CN) .................. 2016 2 0279937 U

(51) Int. Cl.
| H01L 27/02 | (2006.01) |
| H01L 27/12 | (2006.01) |
| G02F 1/1362 | (2006.01) |

(52) U.S. Cl.
CPC ........ *H01L 27/0266* (2013.01); *G02F 1/1362* (2013.01); *H01L 27/0292* (2013.01); *H01L 27/0296* (2013.01); *H01L 27/124* (2013.01)

(58) Field of Classification Search
None
See application file for complete search history.

(56) References Cited

U.S. PATENT DOCUMENTS

2002/0024098 A1  2/2002  Eimori
2005/0140596 A1  6/2005  Lee et al.
(Continued)

FOREIGN PATENT DOCUMENTS

CN    202712185 U    1/2013
CN    103296012 A    9/2013
(Continued)

OTHER PUBLICATIONS

First Office Action from Taiwan Patent Application No. 105142022 dated Jul. 12, 2017.

*Primary Examiner* — Joe Schoenholtz
(74) *Attorney, Agent, or Firm* — Calfee, Halter & Griswold LLP

(57) ABSTRACT

An array substrate and a display device are disclosed. The array substrate includes a base substrate. The base substrate includes a pixel area and a peripheral area surrounding the pixel area, wherein the pixel area and the peripheral area are provided with gate lines, and the peripheral area is provided with an electrostatic discharge branch, a first electrostatic protection unit, and an electrostatic protection line. The electrostatic discharge branch is connected in parallel to a preset section of the gate line, and the preset section of the gate line is located in the peripheral area. The first electrostatic protection unit is connected to the electrostatic discharge branch and the electrostatic protection.

20 Claims, 6 Drawing Sheets

(56) References Cited

U.S. PATENT DOCUMENTS

| | | |
|---|---|---|
| 2005/0190168 A1 | 9/2005 | Jiang et al. |
| 2006/0044488 A1 | 3/2006 | Hwang et al. |
| 2006/0092191 A1 | 5/2006 | Sakai et al. |
| 2007/0246778 A1 | 10/2007 | Liou et al. |
| 2012/0130547 A1 | 5/2012 | Fadell et al. |
| 2014/0001368 A1 | 1/2014 | Huang et al. |
| 2017/0038650 A1* | 2/2017 | Nakanishi ............. G02F 1/1343 |
| 2017/0110478 A1* | 4/2017 | Gai .................... H01L 27/0292 |
| 2018/0088420 A1* | 3/2018 | Hao ................. G02F 1/136204 |

FOREIGN PATENT DOCUMENTS

| | | |
|---|---|---|
| CN | 103890667 A | 6/2014 |
| CN | 105304645 A | 2/2016 |
| CN | 205450520 U | 8/2016 |
| TW | 200521912 A | 7/2005 |
| TW | 200528810 A | 9/2005 |
| TW | 200621381 A | 7/2006 |

* cited by examiner

ARRAY PANEL WITH ESD PROTECTION CIRCUIT

RELATED APPLICATION

The present application is the U.S. national phase entry of PCT/CN2016/098430, with an international filing date of Sep. 8, 2016, which claims the benefit of Chinese Patent Application No. 201620279937.1, filed on Apr. 6, 2016, the entire disclosure of which is incorporated herein by reference.

FIELD

The present disclosure relates to the field of display technology, and particularly to an array substrate and a display device.

BACKGROUND

A display device generally comprises an array substrate and a counter substrate, wherein the structure of the array substrate is complicated and is an important component of the display device. The array substrate typically comprises a base substrate as well as a data line, a gate line and a common electrode line formed on the base substrate. During the manufacturing process or usage process of the array substrate, static electricity with relatively high voltage may be generated on the gate line, which may damage the gate line.

The prior art provides an array substrate comprising a base substrate as well as a gate line, an electrostatic protection unit and an electrostatic protection line arranged on the base substrate, wherein the electrostatic protection unit is connected to the gate line and the electrostatic protection line, respectively. The electrostatic protection unit typically includes elements such as an N-type transistor, and can conduct static electricity to the electrostatic protection line to be discharged when the static electricity is generated on the gate line.

However, the present inventors have found that the prior art at least involves the following problem: there exists a parasitic capacitance in the transistor in the electrostatic protection unit connected to the gate line, thereby affecting normal operation of the gate line.

SUMMARY

Embodiments of the present disclosure provide an array substrate and a display device, which are capable of at least partially alleviating or eliminating the problem in the prior art.

According to an aspect of the present disclosure, there is provided an array substrate comprising a base substrate. The base substrate comprises a pixel area and a peripheral area surrounding the pixel area, wherein the pixel area and the peripheral area are provided with gate lines, and the peripheral area are provided with an electrostatic discharge branch, a first electrostatic protection unit, and an electrostatic protection line.

The electrostatic discharge branch is connected in parallel to a preset section of the gate line, wherein the preset section of the gate line is located in the peripheral area.

The first electrostatic protection unit is connected to the electrostatic discharge branch and the electrostatic protection line, respectively.

According to some embodiments, the first electrostatic protection unit comprises a first N-type transistor and a second N-type transistor. A gate and a source of the first N-type transistor are both connected to the electrostatic discharge branch, and a drain of the first N-type transistor is connected to the electrostatic protection line. A gate and a source of the second N-type transistor are both connected to the electrostatic protection line, and a drain of the second N-type transistor is connected to the electrostatic discharge branch.

According to some embodiments, in the peripheral area, the base substrate is provided with a first pattern including the gate of the first N-type transistor, the gate of the second N-type transistor, the gate line, and the electrostatic discharge branch.

According to some embodiments, in the peripheral area, the base substrate provided with the first pattern is further provided with a second pattern including the source and the drain of the first N-type transistor, the source and the drain of the second N-type transistor, and the electrostatic protection line.

According to some embodiments, in the peripheral area, the base substrate provided with the second pattern is provided with a first electrode and a second electrode. The first electrode is connected to the source of the first N-type transistor and the electrostatic discharge branch respectively via two via holes, and the second electrode is connected to the gate of the second N-type transistor and the electrostatic protection line respectively via two via holes.

According to some embodiments, in the peripheral area, the first electrostatic protection unit is further connected to a portion of the gate line other than the preset section of the gate line.

According to some embodiments, the first electrostatic protection unit comprises a first N-type transistor and a second N-type transistor.

In the peripheral area, a gate of the first N-type transistor is connected to the electrostatic discharge branch, a drain of the first N-type transistor is connected to the electrostatic protection line, and a source of the first N-type transistor is connected to a portion of the gate line other than the preset section of the gate line.

In the peripheral area, a gate and a source of the second N-type transistor are both connected to the electrostatic protection line, and a drain of the second N-type transistor are connected to a portion of the gate line other than the preset section of the gate line.

According to some embodiments, in the peripheral area, the electrostatic protection line is arranged to perpendicularly intersect the electrostatic discharge branch and the preset section of the gate line, respectively.

According to some embodiments, the peripheral area is further provided with a common electrode line and a second electrostatic protection unit. The second electrostatic protection unit is connected to the electrostatic protection line and the common electrode line, respectively.

According to some embodiments, in the peripheral area, the common electrode line is arranged to perpendicularly intersect the electrostatic discharge branch and the preset section of the gate line, respectively.

According to some embodiments, the second electrostatic protection unit comprises a third N-type transistor and a fourth N-type transistor.

A gate and a source of the third N-type transistor are both connected to the electrostatic protection line, and a drain of the third N-type transistor is connected to the common electrode line.

A gate and a source of the fourth N-type transistor are both connected to the common electrode line, and a drain of the fourth N-type transistor is connected to the electrostatic protection line.

According to some embodiments, the electrostatic discharge branch is connected to the preset section of the gate line via a wire. The orthographic projection of the wire on the base substrate is located between the orthographic projection of the electrostatic protection line on the base substrate and the orthographic projection of the common electrode line on the base substrate.

According to some embodiments, the electrostatic discharge branch is connected to the preset section of the gate line via a wire.

According to some embodiments, the electrostatic protection line is a common electrode line.

According to some embodiments, the peripheral area is further provided with a common electrode line, and the common electrode line is connected to the electrostatic protection line via a wire.

According to another aspect of the present disclosure, there is provided a display device comprising any array substrate provided above.

In the array substrate and the display device provided by embodiments of the present disclosure, by connecting the preset section of the gate line in parallel to the electrostatic discharge branch and connecting the first electrostatic protection unit to the electrostatic discharge branch, it is possible to solve the problem in the prior art that when the gate line is in normal operation, there exists a parasitic capacitance in the transistor in the electrostatic protection unit, which affects normal operation of the gate line. When the gate line is in normal operation, the electrostatic protection unit has a small impact on the gate line signal, so that the gate line signal can be transmitted on the preset section of the gate line with smaller impedance; however, when static electricity is generated on the gate line, the electrostatic protection unit is turned on so that the static electricity flows from the electrostatic discharge branch to the electrostatic protection line to be discharged.

BRIEF DESCRIPTION OF DRAWINGS

In order to more clearly illustrate the technical solutions in embodiments of the present disclosure, the drawings required for description of the embodiments will be briefly described below. It is apparent that the drawings in the description below are merely some embodiments of the present disclosure and that other drawings may be obtained by those skilled in the art based on these drawings without spending inventive efforts.

Figure 1:
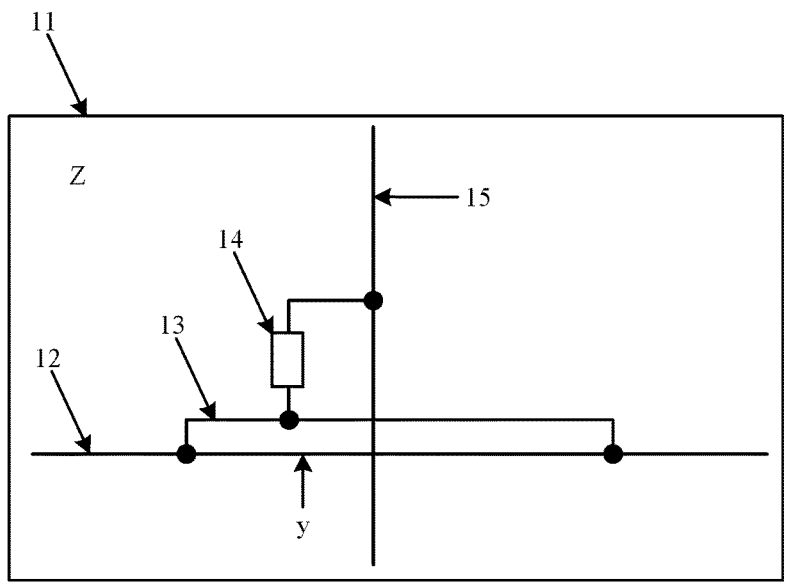
FIG. 1 is a schematic view showing the circuit structure of an array substrate provided by embodiments of the present disclosure.

The drawings and corresponding description thereof are not intended to limit the scope of the present disclosure in any way, but rather to illustrate the concept of the present disclosure to those skilled in the art by reference to specific embodiments.

DETAILED DESCRIPTION

To make the objectives, technical solutions and advantages of the present disclosure clearer, embodiments of the present disclosure will be described below in further detail with reference to the accompanying drawings.

In the drawings, the following reference numerals are used:

11—base substrate
Z—peripheral area
12—gate line
13—electrostatic discharge branch
14—first electrostatic protection unit
15—electrostatic protection line
y—preset section of the gate line
T1—first N-type transistor
g1—gate of the first N-type transistor
s1—source of the first N-type transistor
d1—drain of the first N-type transistor
T2—second N-type transistor
g2—gate of the second N-type transistor
s2—source of the second N-type transistor
d2—drain of the second N-type transistor
j1—first electrode
j2—second electrode
k1 and k2—via hole
16—common electrode line
17—second electrostatic protection unit
T3—third N-type transistor
g3—gate of the third N-type transistor
s3—source of the third N-type transistor
d3—drain of the third N-type transistor
T4—fourth N-type transistor
g4—gate of the fourth N-type transistor
s4—source of the fourth N-type transistor
d4—drain of the fourth N-type transistor
18 and 19—wire
b1—active layer of the first N-type transistor
b2—active layer of the second N-type transistor
31—passivation layer
32—gate insulating layer FIG. 1 is a schematic view showing the circuit structure of an array substrate provided by embodiments of the present disclosure. The array substrate may comprise a base substrate 11. The base substrate 11 comprises a pixel area (not shown in FIG. 1) and a peripheral area Z surrounding the pixel area, wherein the pixel area and the peripheral area Z are provided with a gate line 12, and the peripheral area Z is provided with an electrostatic discharge branch 13, an first electrostatic protection unit 14 and an electrostatic protection line 15.

The electrostatic discharge branch 13 is connected in parallel to a preset section y of the gate line 12, and the preset section y of the gate line is located in the peripheral area Z.

The first electrostatic protection unit 14 is connected to the electrostatic discharge branch 13 and the electrostatic protection line 15, respectively.

In embodiments of the present disclosure, the gate line 12 extends into the pixel area (not shown in FIG. 1).

In the array substrate provided by embodiments of the present disclosure, by connecting the preset section of the gate line in parallel to the electrostatic discharge branch and connecting the first electrostatic protection unit to the electrostatic discharge branch, it is possible to solve the problem in the prior art that when the gate line is in normal operation, there exists a parasitic capacitance in the transistor in the electrostatic protection unit, which affects normal operation of the gate line. When the gate line is in normal operation, the electrostatic protection unit has a small impact on the gate line signal, so that the gate line signal can be transmitted on the preset section of the gate line with smaller impedance; however, when static electricity is generated on the gate line, the electrostatic protection unit is turned on so that the static electricity flows from the electrostatic discharge branch to the electrostatic protection line to be discharged.

Figure 2:
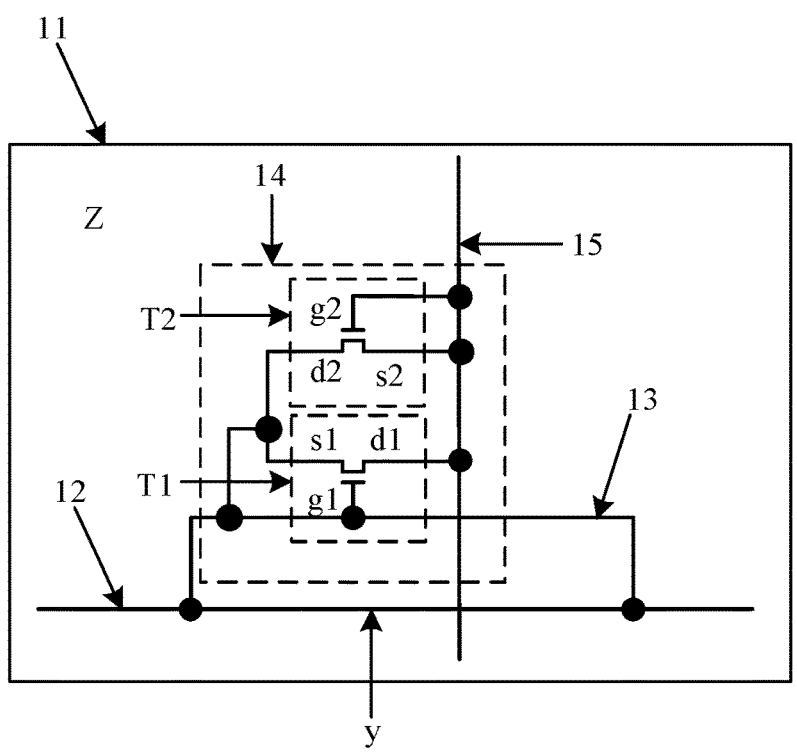
FIG. 2 is a schematic view showing the circuit structure of another array substrate provided by embodiments of the present disclosure.

Further, referring to FIG. 2, it illustrates a schematic view showing the circuit structure of another array substrate provided by embodiments of the present disclosure.

As shown in FIG. 2, the first electrostatic protection unit 14 comprises a first N-type transistor T1 and a second N-type transistor T2.

A gate g1 and a source s1 of the first N-type transistor T1 are both connected to the electrostatic discharge branch 13, and the drain d1 of the first N-type transistor T1 is connected to the electrostatic protection line 15.

A gate g2 and a source s2 of the second N-type transistor T2 are both connected to the electrostatic protection line 15, and the drain d2 of the second N-type transistor T2 is connected to the electrostatic discharge branch 13.

When static electricity is generated on the gate line 12, the first N-type transistor T1 is turned on, so that the static electricity on the gate line 12 passes through the electrostatic discharge branch 13 and flows to the electrostatic protection line 15 through the source s1 of the first N-type transistor T1 and the drain d1 of the first N-type transistor T1. When the static electricity has flowed into the electrostatic protection line 15, the second N-type transistor T2 is turned on so that the static electricity on the electrostatic protection line 15 flows to the electrostatic discharge branch 13 through the source s2 of the second N-type transistor T2 and the drain d2 of the second N-type transistor T2.

In FIG. 2, the source s1 of the first transistor T1 and the drain d2 of the second transistor T2 may be connected to each other and then connected to the electrostatic discharge branch 13, or may be connected to the electrostatic discharge branch 13, respectively.

Figure 3:
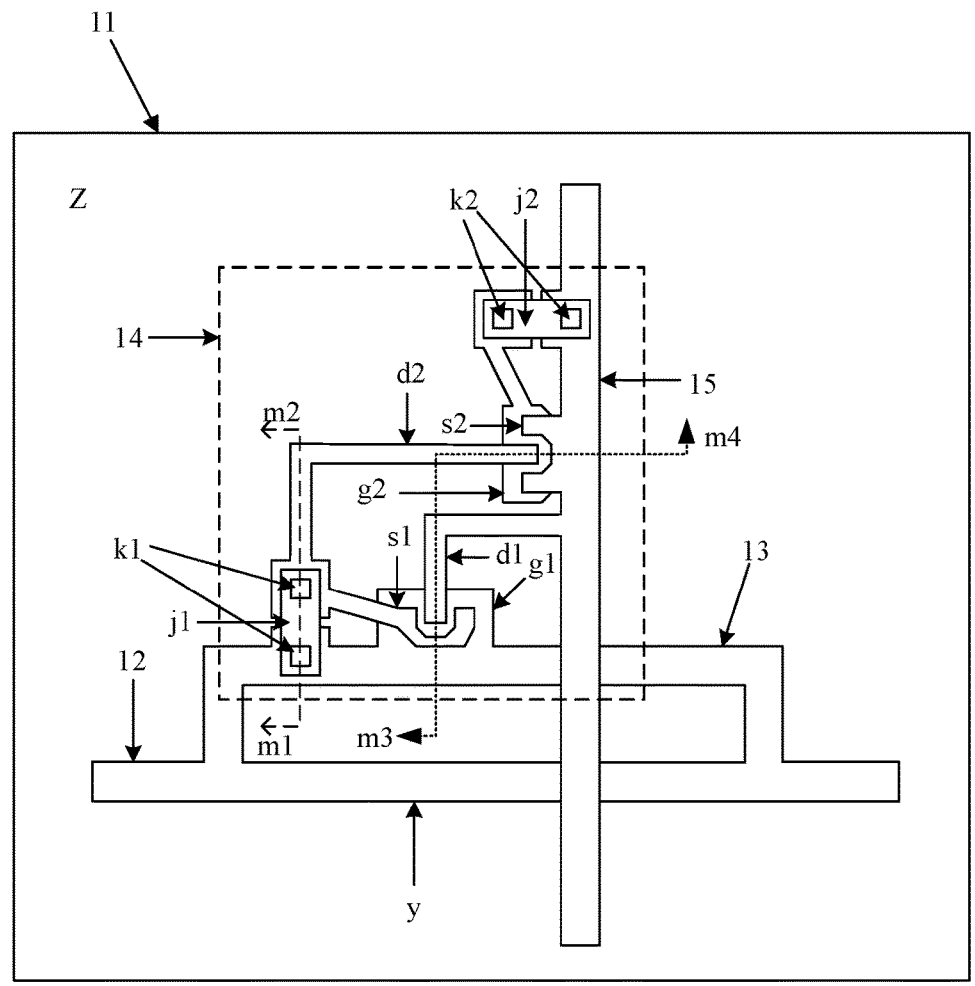
FIG. 3 is a schematic view showing the circuit wiring structure of an array substrate provided by embodiments of the present disclosure.

FIG. 3 is a schematic view showing the circuit wiring structure of an array substrate provided by embodiments of the present disclosure. As shown in FIG. 3, in the peripheral area Z, the base substrate 11 is provided with a first pattern including the gate g1 of the first N-type transistor T1, the gate g2 of the second N-type transistor T2, the gate line 12, and the electrostatic discharge branch 13.

In the peripheral area Z, the base substrate 11 provided with the first pattern is further provided with a second pattern including the source s1 and the drain d1 of the first N-type transistor T1, the source s2 and the drain d2 of the second N-type transistor T2, and the electrostatic protection line 15.

In the peripheral area Z, the base substrate 11 provided with the second pattern is further provided with a first electrode j1 and a second electrode j2, wherein the first electrode j1 is connected to the source s1 of the first N-type transistor T1 and the electrostatic discharge branch 13 via two via holes k1, respectively, and the second electrode j2 is connected to the gate g2 of the second N-type transistor T2 and the electrostatic protection line 15 via two via holes k2, respectively. The materials of the first electrode j1 and the second electrode j2 may include indium tin oxide (ITO).

It is to be noted that, in order to make the illustration clearer, the patterns of active layers of the first N-type transistor T1 and the second N-type transistor T2 is not shown in FIG. 3.

Figure 4:
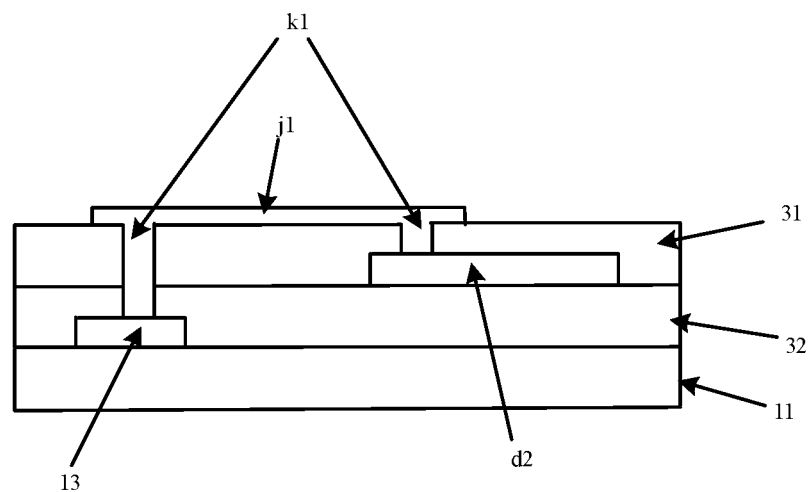
FIG. 4 is a schematic sectional view taken along the line m1-m2 in the array substrate shown in FIG. 3.

FIG. 4 is a schematic sectional view taken along the line m1-m2 in the schematic view of the circuit wiring structure of the array substrate as shown in FIG. 3, wherein k1 denotes the via hole, j1 denotes the first electrode, 13 denotes the electrostatic discharge branch, d2 denotes the drain of the second N-type transistor T2, 11 denotes the base substrate, 32 denotes the gate insulating layer, and 31 denotes the passivation layer.

Figure 5:
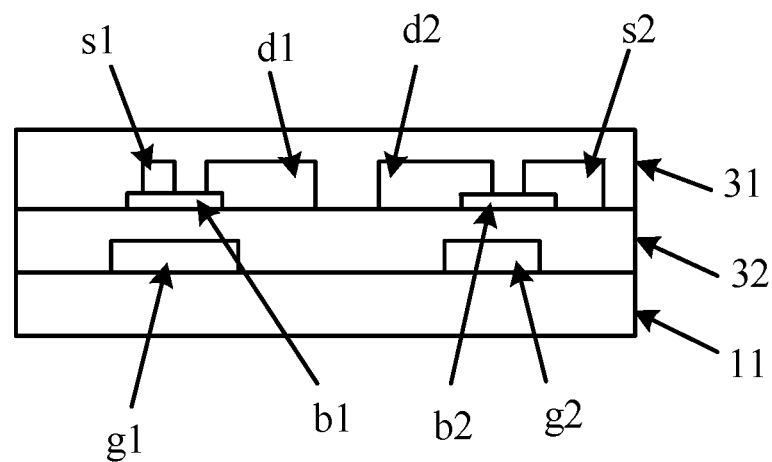
FIG. 5 is a schematic sectional view taken along the line m3-m4 in the array substrate shown in FIG. 3.

FIG. 5 is a schematic sectional view taken along the line m3-m4 in the schematic view of the circuit wiring structure of the array substrate as shown in FIG. 3, wherein g1 denotes the gate of the first N-type transistor T1, g2 denotes the gate of the second N-type transistor T2, s1 denotes the source of the first N-type transistor T1, d1 denotes the drain of the first N-type transistor T1, b1 denotes the active layer of the first N-type transistor T1, s2 denotes the source of the second N-type transistor T2, d2 denotes the drain of the second N-type transistor T2, b2 denotes an active layer of the second N-type transistor T2, 11 denotes the base substrate, 31 denotes the passivation layer, and 32 denotes the gate insulating layer.

Figure 6:
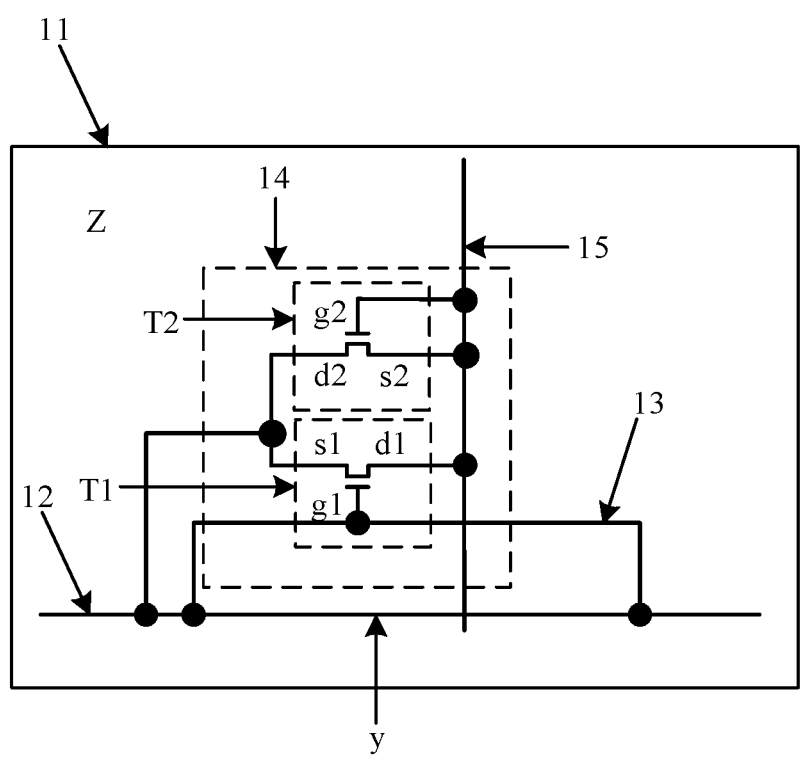
FIG. 6 is a schematic view showing the circuit structure of an array substrate provided by embodiments of the present disclosure.

FIG. 6 shows a schematic view of the circuit structure provided by embodiments of the present disclosure. In the peripheral area Z of the base substrate 11, the first electrostatic protection unit 14 is further connected to a portion of the gate line 12 other than the preset section y of the gate line, and the first electrostatic protection unit 14 comprises a first N-type transistor T1 and a second N-type transistor T2.

In the peripheral area Z, the gate g1 of the first N-type transistor T1 is connected to the electrostatic discharge branch 13, the drain d1 of the first N-type transistor T1 is connected to the electrostatic protection line 15, and the source s1 of the first N-type transistor T1 is connected to a portion of the gate line 12 other than the preset section y of the gate line.

In the peripheral area Z, the gate g2 and the source s2 of the second N-type transistor T2 are both connected to the electrostatic protection line 15, and the drain d2 of the second N-type transistor T2 is connected to a portion of the gate line 12 other than the preset section y of the gate line 12.

In FIG. 6, the source s1 of the first transistor T1 and the drain d2 of the second transistor T2 may be connected to each other and then connected to a portion of the gate line 12 other than the preset section y of the gate line, or may be connected to a portion of the gate line 12 other than the preset section y of the gate line, respectively.

In FIGS. 1, 2, 3 and 6, in the peripheral area Z, the electrostatic protection line 15 is arranged to perpendicularly intersect the electrostatic discharge branch 13 and the preset section y of the gate line 12, respectively. With the arrangement of perpendicular intersection, the overlapping areas of the electrostatic protection line 15 with the electrostatic discharge branch 13 and the preset section y of the gate line 12 can be reduced respectively, so that the coupling capacitances of the electrostatic protection line 15 with the electrostatic discharge branch 13 and the preset section y of the gate line 12 can be reduced respectively, thereby reducing the impact of the coupling capacitance on the circuit and improving the performance of the circuit.

It is to be noted that, in FIGS. 1, 2, 3 and 6, the electrostatic discharge branch 13 may be connected to the preset section y of the gate line 12 via a wire (not shown). The wire can reduce the resistance for the gate line signal when it is transmitted on the electrostatic discharge branch 13 and the preset section y of the gate line 12, thereby improving the performance of the circuit. In addition, the electrostatic protection line 15 in FIGS. 1, 2, 3 and 6 may be a common electrode line.

Figure 7:
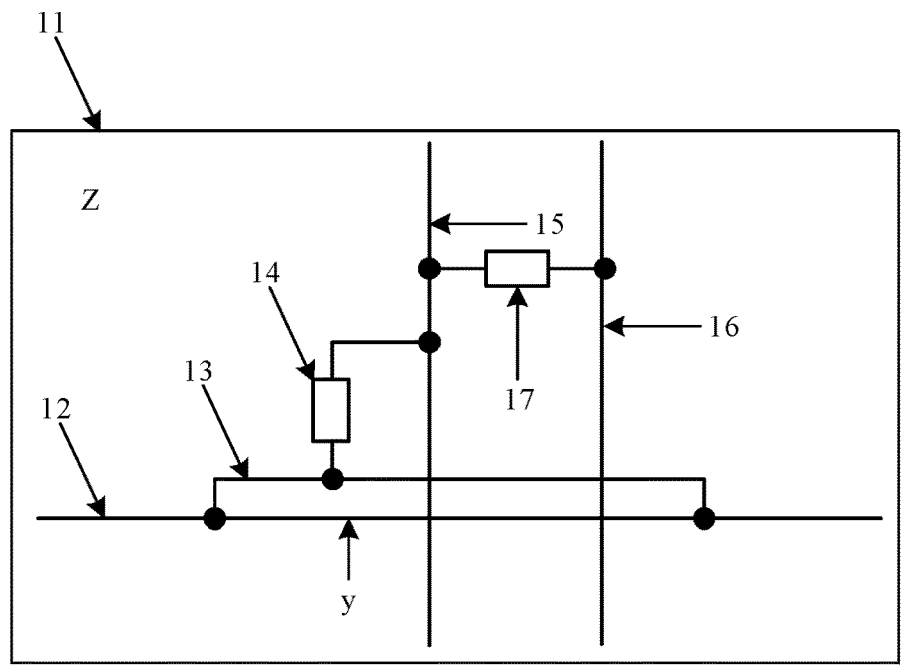
FIG. 7 is a schematic view showing the circuit structure of an array substrate provided by embodiments of the present disclosure.

FIG. 7 is a schematic view showing the circuit structure of an array substrate provided by embodiments of the present disclosure, wherein the peripheral area Z is further provided with a common electrode line 16 and a second electrostatic protection unit 17.

The second electrostatic protection unit 17 is connected to the electrostatic protection line 15 and the common electrode line 16, respectively. The meanings of other reference numerals in FIG. 7 may refer to FIG. 2, which will not be described here for simplicity.

Static electricity flowing into the electrostatic protection line 15 can flow into the common electrode line 16 through the second electrostatic protection unit 17 and be discharged by the common electrode line 16.

Figure 8:
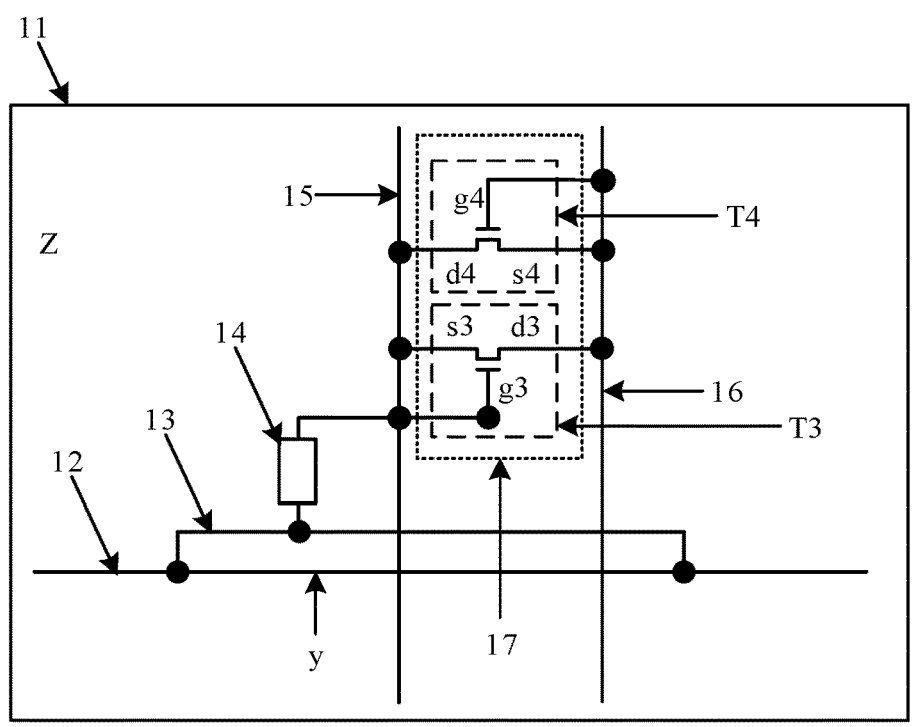
FIG. 8 is a schematic view showing the circuit structure of an array substrate provided by embodiments of the present disclosure.

FIG. 8 illustrates a schematic view of the circuit structure of a second electrostatic protection unit 17 in the schematic view of the circuit structure as shown in FIG. 7. The second electrostatic protection unit 17 comprises a third N-type transistor T3 and a fourth N-type transistor T4. A gate g3 and a source s3 of the third N-type transistor T3 are both connected to the electrostatic protection line 15, and a drain d3 of the third N-type transistor T3 is connected to the common electrode line 16.

A gate g4 and a source s4 of the fourth N-type transistor T4 are both connected to the common electrode line 16, and a drain d4 of the fourth N-type transistor T4 is connected to the electrostatic protection line 15. The meanings of other reference numerals in FIG. 8 may refer to FIG. 7, which will not be described here for simplicity.

Figure 9:
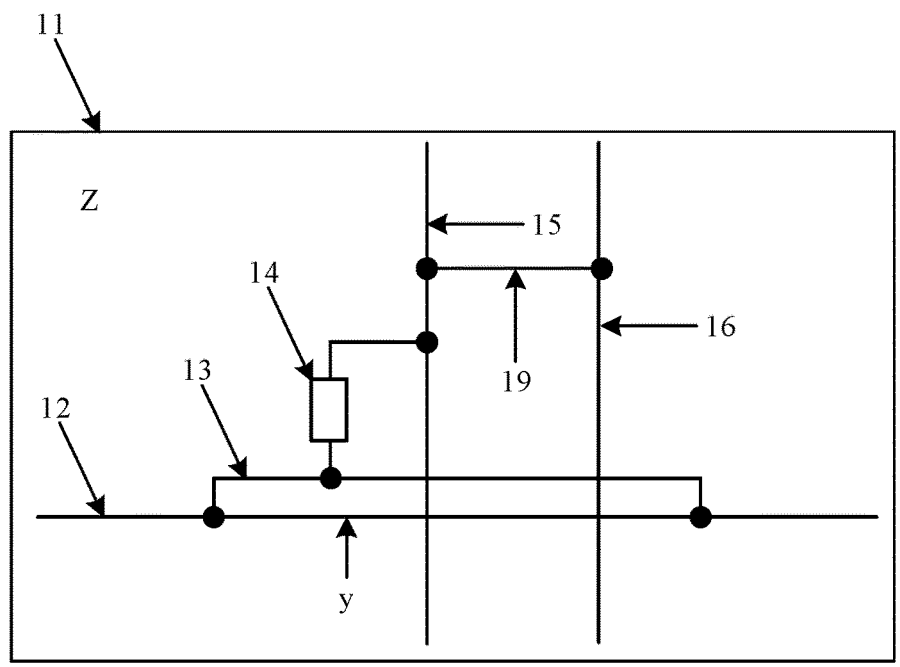
FIG. 9 is a schematic view showing the circuit structure of an array substrate provided by embodiments of the present disclosure.

The common electrode line 16 and the electrostatic protection line 15 may also be connected to each other directly without the second electrostatic protection unit 17 arranged. As shown in FIG. 9, the peripheral area Z is further provided with the common electrode line 16. The common electrode line 16 is connected to the electrostatic protection line 15 via a wire 19. The meanings of other reference numerals in FIG. 9 may refer to FIG. 7, which will not be described here for simplicity.

Figure 10:
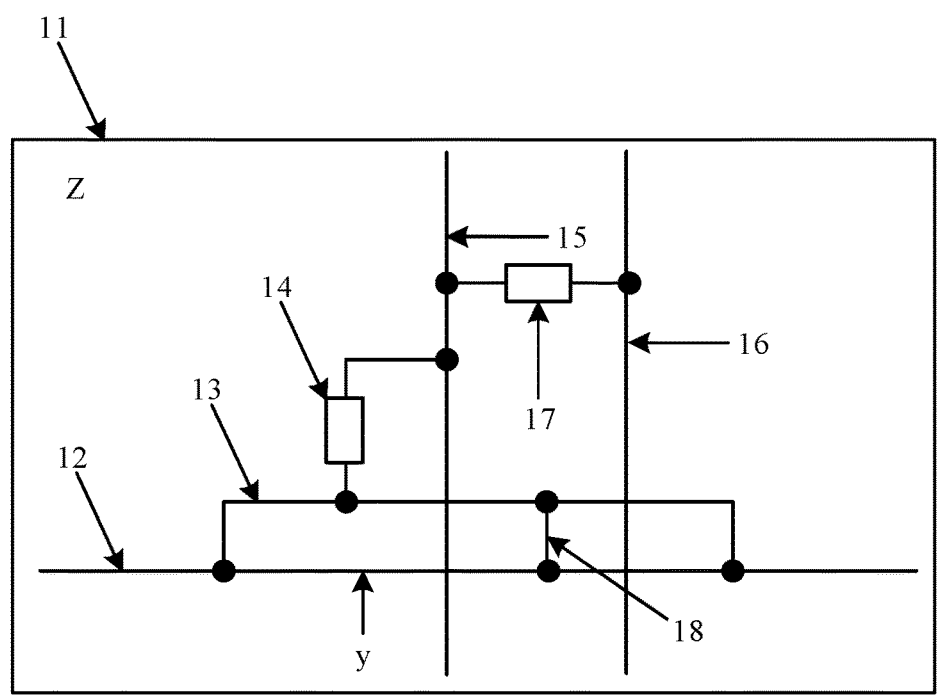
FIG. 10 is a schematic view showing the circuit structure of an array substrate provided by embodiments of the present disclosure.

FIG. 10 is a schematic view showing the circuit structure of an array substrate provided by embodiments of the present disclosure. As shown in FIG. 10, the electrostatic discharge branch 13 is connected to the preset section y of the gate line 12 via a wire 18, and the orthographic projection of the wire 18 on the base substrate 11 is located between the orthographic projection of the electrostatic protection line 15 on the base substrate 11 and the orthographic projection of the common electrode line 16 on the base substrate 11. The electrostatic discharge branch 13 intersects the electrostatic protection line 15 and the common electrode line 16, respectively, and the preset section y of the gate line 12 intersects the electrostatic protection line 15 and the common electrode line 16, respectively. The connection of the wire 18 between the electrostatic discharge branch 13 and the preset section y of the gate line 12 can reduce the resistance for the gate line signal when it is transmitted on the electrostatic discharge branch 13 and the preset section y of the gate line, thereby further improving the performance of the circuit structure of the array substrate. The specific structure of the first electrostatic protection unit 14 in FIG. 10 may refer to FIG. 2 or FIG. 6, and the specific structure of the second electrostatic protection unit 17 may refer to FIG. 8, which will not be described here for simplicity.

In FIGS. 7 to 10, in the peripheral area Z, the common electrode line 16 is arranged to perpendicularly intersect the electrostatic discharge branch 13 and the preset section y of the gate line 12, respectively. With the arrangement of perpendicular intersection, the overlapping areas of the common electrode line 16 with the electrostatic discharge branch 13 and the preset section y of the gate line 12 can be reduced respectively, so that the coupling capacitances of the common electrode line 16 with the electrostatic discharge branch 13 and the preset section y of the gate line 12 can be reduced respectively, thereby reducing the impact of the coupling capacitance on the circuit and improving the performance of the circuit.

It is to be noted that the electrostatic protection line 15 on each of the array substrates provided by embodiments of the present disclosure may be an electrostatic protection line for a plurality of gate lines on the array substrate.

In the array substrate provided by embodiments of the present disclosure, by connecting the preset section of the gate line in parallel to the electrostatic discharge branch and connecting the first electrostatic protection unit to the electrostatic discharge branch, it is possible to solve the problem in the prior art that when the gate line is in normal operation, there exists a parasitic capacitance in the transistor in the electrostatic protection unit, which affects normal operation of the gate line. When the gate line is in normal operation, the electrostatic protection unit has a small impact on the gate line signal, so that the gate line signal can be transmitted on the preset section of the gate line with smaller impedance; however, when static electricity is generated on the gate line, the electrostatic protection unit is turned on so that the static electricity flows from the electrostatic discharge branch to the electrostatic protection line to be discharged.

Embodiments of the present disclosure further provide a display device which may comprise any of the array substrates shown in FIGS. 1 to 10.

The contents stated above are merely exemplary embodiments of the present disclosure and are not intended to limit the present disclosure. Any modifications, equivalent substitutions, improvements, and the like within the spirit and principle of the present disclosure should be encompassed within the scope of the present disclosure.

The invention claimed is:

1. An array substrate comprising:
   a base substrate;
   wherein the base substrate comprising comprises a pixel area and a peripheral area surrounding the pixel area, the pixel area and the peripheral area have gate lines, and the peripheral area has an electrostatic discharge branch, a first electrostatic protection unit, and an electrostatic protection line;
wherein the electrostatic discharge branch is connected in parallel to a preset section of the gate line, the preset section of the gate line is located in the peripheral area; and
wherein the first electrostatic protection unit is connected to the electrostatic discharge branch and the electrostatic protection line.

2. The array substrate according to claim 1, wherein the first electrostatic protection unit comprises a first N-type transistor and a second N-type transistor:
wherein a gate and a source of the first N-type transistor are both connected to the electrostatic discharge branch, and a drain of the first N-type transistor is connected to the electrostatic protection line; and
wherein a gate and a source of the second N-type transistor are both connected to the electrostatic protection line, and a drain of the second N-type transistor is connected to the electrostatic discharge branch.

3. The array substrate according to claim 2, wherein in the peripheral area, the base substrate has a first pattern including the gate of the first N-type transistor, the gate of the second N-type transistor, the gate line, and the electrostatic discharge branch.

4. The array substrate according to claim 3, wherein in the peripheral area, the base substrate having the first pattern has a second pattern including the source and the drain of the first N-type transistor, the source and the drain of the second N-type transistor, and the electrostatic protection line.

5. The array substrate according to claim 4, wherein in the peripheral area, the base substrate having the second pattern has a first electrode and a second electrode, wherein the first electrode is connected to the source of the first N-type transistor and the electrostatic discharge branch via two via holes, and wherein the second electrode is connected to the gate of the second N-type transistor and the electrostatic protection line via another two via holes.

6. The array substrate according to claim 1, wherein in the peripheral area, the first electrostatic protection unit is further connected to a portion of the gate line other than the preset section of the gate line.

7. The array substrate according to claim 6, wherein the first electrostatic protection unit comprises a first N-type transistor and a second N-type transistor, in the peripheral area, a gate of the first N-type transistor is connected to the electrostatic discharge branch, a drain of the first N-type transistor is connected to the electrostatic protection line, and a source of the first N-type transistor is connected to a portion of the gate line other than the preset section of the gate line;
in the peripheral area, a gate and a source of the second N-type transistor are both connected to the electrostatic protection line, and a drain of the second N-type transistor is connected to the portion of the gate line other than the preset section of the gate line.

8. The array substrate according to claim 1, wherein in the peripheral area, the electrostatic protection line is arranged to perpendicularly intersect the electrostatic discharge branch and the preset section of the gate line.

9. The array substrate according to claim 1, wherein the peripheral area is further provided with a common electrode line and a second electrostatic protection unit, and the second electrostatic protection unit is connected to the electrostatic protection line and the common electrode line.

10. The array substrate according to claim 9, wherein in the peripheral area, the common electrode line perpendicularly intersects the electrostatic discharge branch and the preset section of the gate line.

11. The array substrate according to claim 9, wherein the second electrostatic protection unit comprises a third N-type transistor and a fourth N-type transistor,
wherein a gate and a source of the third N-type transistor are both connected to the electrostatic protection line, and a drain of the third N-type transistor is connected to the common electrode line;
wherein a gate and a source of the fourth N-type transistor are both connected to the common electrode line, and a drain of the fourth N-type transistor is connected to the electrostatic protection line.

12. The array substrate according to claim 9, wherein the electrostatic discharge branch is connected to the preset section of the gate line via a wire, an orthographic projection of the wire on the base substrate is located between an orthographic projection of the electrostatic protection line on the base substrate and an orthographic projection of the common electrode line on the base substrate.

13. The array substrate according to claim 1, wherein the electrostatic discharge branch is connected to the preset section of the gate line via a wire.

14. The array substrate according to claim 1, wherein the electrostatic protection line is a common electrode line.

15. The array substrate according to claim 1, wherein the peripheral area is further provided with a common electrode line, and
the common electrode line is connected to the electrostatic protection line via a wire.

16. A display device comprising the array substrate according to claim 1.

17. The display device according to claim 16, wherein the first electrostatic protection unit comprises a first N-type transistor and a second N-type transistor,
wherein a gate and a source of the first N-type transistor are both connected to the electrostatic discharge branch, and a drain of the first N-type transistor being connected to the electrostatic protection line;
wherein a gate and a source of the second N-type transistor are both connected to the electrostatic protection line, and a drain of the second N-type transistor are connected to the electrostatic discharge branch.

18. The display device according to claim 17, wherein in the peripheral area, the base substrate has a first pattern including the gate of the first N-type transistor, the gate of the second N-type transistor, the gate line, and the electrostatic discharge branch.

19. The display device according to claim 18, wherein in the peripheral area, the base substrate having the first pattern is provided with a second pattern including the source and the drain of the first N-type transistor, the source and the drain of the second N-type transistor, and the electrostatic protection line.

20. The display device according to claim 19, wherein in the peripheral area, the base substrate having the second pattern is provided with a first electrode and a second electrode, the first electrode being connected to the source of the first N-type transistor and the electrostatic discharge branch via two via holes, and wherein the second electrode is connected to the gate of the second N-type transistor and the electrostatic protection line via two via holes.

* * * * *